United States Patent [19]
Ogawa

[11] Patent Number: 5,213,996
[45] Date of Patent: May 25, 1993

[54] METHOD AND APPARATUS FOR FORMING INTERCONNECTION PATTERN AND SEMICONDUCTOR DEVICE HAVING SUCH INTERCONNECTION PATTERN

[75] Inventor: Toshiaki Ogawa, Hyogo, Japan

[73] Assignee: Mitsubishi Denki Kabushiki Kaisha, Tokyo, Japan

[21] Appl. No.: 828,823

[22] Filed: Jan. 31, 1992

Related U.S. Application Data

[62] Division of Ser. No. 683,648, Apr. 11, 1991, Pat. No. 5,110,394.

[30] Foreign Application Priority Data

Jul. 4, 1990 [JP] Japan .................. 2-178288

[51] Int. Cl.⁵ .................. H01L 21/283; H01L 21/302
[52] U.S. Cl. .................. 437/173; 437/187; 437/228; 437/245
[58] Field of Search .............. 437/173, 187, 228, 245; 156/643

[56] References Cited

U.S. PATENT DOCUMENTS

| | | |
|---|---|---|
| 4,643,799 | 2/1987 | Tsujii et al. |
| 4,682,054 | 7/1987 | McLaughlin |
| 4,715,921 | 12/1987 | Maher et al. |
| 4,825,808 | 5/1989 | Takahashi et al. |
| 5,017,513 | 5/1991 | Takeuchi .................. 437/228 |
| 5,030,852 | 7/1991 | Higashisaka |

FOREIGN PATENT DOCUMENTS

| | | | |
|---|---|---|---|
| 57-53966 | 3/1982 | Japan | 437/187 |
| 1-276720 | 11/1989 | Japan | 437/228 |

OTHER PUBLICATIONS

1985 Dry Process Symposium, "Si Surface TGreatment Using Deep UV Irradiation", Ikawa et al., Oct. 1985, pp. 25-29.

Primary Examiner—Olik Chaudhuri
Assistant Examiner—Ourmazd S. Ojan
Attorney, Agent, or Firm—Lowe, Price, LeBlanc & Becker

[57] ABSTRACT

Disclosed is a method of forming an interconnection pattern which causes no disconnection even when making contact with water in the atmosphere. An interconnection layer is formed on a semiconductor substrate. The interconnection layer is selectively etched by employing a halogen-type gas, to form an interconnection pattern. Ultraviolet rays are directed onto the interconnection pattern in the atmosphere including a hydrogen gas. This method avoids generation of hydrogen halogenide which causes corrosion of metal interconnections even when the metal interconnections make contact with water in the atmosphere, thereby to prevent disconnections of the metal interconnections.

19 Claims, 7 Drawing Sheets

METHOD AND APPARATUS FOR FORMING INTERCONNECTION PATTERN AND SEMICONDUCTOR DEVICE HAVING SUCH INTERCONNECTION PATTERNinterconnections.

This application is a division of application Ser. No. 07/683,648 filed Apr. 11, 1991, now U.S. Pat. No. 5,110,394.

BACKGROUND OF THE INVENTION

1. Field of the Invention

The present invention relates generally to a method of forming interconnection patterns and, more particularly, to an improved method of forming interconnection patterns, which enables prevention of corrosion of metal interconnections. The invention further relates to an apparatus for manufacturing such a semiconductor device. The invention also relates to a semiconductor device having such interconnection patterns.

2. Description of the Background Art

In a manufacture process of a semiconductor device, the step of forming interconnection patterns is indispensable. FIGS. 4A and 4B show cross-sectional views showing the step of forming interconnection patterns.

With reference to FIG. 4A, a gate 31 and an interlayer insulation film 32 are formed on a semiconductor substrate 30. A contact hole 33b for exposing source/drain regions (not shown) of a transistor and a contact hole 33a for exposing a portion of a surface of gate 31 are formed in interlayer insulation film 32. An interconnection layer 34 made of an aluminum alloy film is then formed on interlayer insulation film 32 so as to fill these contact holes 33a and 33b. A resist 35 patterned in a predetermined form is formed on interconnection layer 34.

Referring to FIG. 4B, interconnection patterns 36 are formed by selectively etching interconnection layer 34, with resist 35 used as mask.

As a conventional method of forming interconnection patterns of aluminum alloy, such a method is provided that aluminum interconnection layer 34 is subjected to a wet etching process employing a mixed solution of phosphoric acid, nitric acid, etc., using resist 35. This method, however, has difficulties in formation of micro patterns less than or equal to 3 μm due to an enhancement of etching extending under resist patterns 35, a so-called under-etching. Thus, a method employing a reactive ion etching (hereinafter referred to as RIE etching) using a gas such as of chlorine or a compound containing chlorine, e.g., $Cl_2$, $SiCl_4$, $BCl_3$, etc. has been adopted for formation of such micro patterns.

A description will be given in detail on the conventional method of forming interconnection patterns by RIE etching and also on disadvantages of the conventional method.

A lower insulator film 3 is formed on a semiconductor substrate 30, with reference to FIG. 5A. A metal interconnection layer 2 such as of AlSi, AlSiCu, Cu, Mg, etc. is then formed on lower insulator film 3. A resist pattern 1 of a predetermined form is then formed on metal interconnection layer 2.

Referring to FIG. 5B, metal interconnection layer 2 is subjected to reactive ion etching by employing a halogen-type gas containing chlorine such as $Cl_2$, $SiCl_4$, $BCl_3$ and so on, with resist pattern 1 used as mask. This reactive ion etching causes metal interconnection layer 2 to be selectively etched, resulting in formation of an interconnection pattern 2a. At this time, a protection film 4 including halogen is formed on sidewalls of resist pattern 1 and interconnection pattern 2a. Protection film 4 serves to suppress isotropical etching and enhance anisotropy. This protection film is made by a complicated reaction of components of the resist, interconnection layer and halogen-type gas and includes halogen.

An ashing processing with a $O_2$ gas 5 is carried out to remove resist pattern 1, with reference to FIGS. 5B and 5C. Even after the ashing processing, a protection film 6 containing halogen remains on the sidewall of interconnection pattern 2a. The micro interconnection pattern 2a is thus formed.

This method, however, has a disadvantage that when the semiconductor device is taken out in the atmosphere, a corroded portion 9 is formed on the sidewall of interconnection pattern 2a, as shown in FIG. 5D, thereby inducing disconnection of interconnection pattern 2a.

The causes for the corrosion are as follows: protection film 6 contains halogen, e.g., chlorine, and when exposed in the atmosphere, reacts with water molecules 7 in the atmosphere to generate a hydrochloric acid. The generated hydrochloric acid acts on interconnection pattern 2a, to produce reaction products 8 (e.g., metal chloride). When reaction products 8 are separated from the sidewall of interconnection pattern 2a, interconnection pattern 2a becomes gradually corroded.

SUMMARY OF THE INVENTION

One object of the present invention is therefore to provide an improved method of forming interconnection patterns which enables prevention of corrosion of metal interconnections.

Another object of the present invention is to provide an improved method of forming interconnection patterns which causes no corrosion of metal interconnections even if the metal interconnections make contact with water in the atmosphere.

A further object of the present invention is to form anti-corrosive interconnection patterns even for a wet processing, which is a processing step to be carried out after formation of interconnection patterns.

A still further object of the present invention is to provide an apparatus in which anti-corrosive interconnection patterns can be formed.

A still further object of the present invention is to provide a semiconductor device having an interconnection pattern which causes no corrosion even if making contact with water or the like in the atmosphere.

In an interconnection pattern forming method according to a first aspect of the present invention, an interconnection layer is first formed on a substrate. The interconnection layer is selectively etched by employing a halogen-type gas, so as to form an interconnection pattern. The interconnection pattern is then irradiated with ultraviolet rays in the atmosphere including reducing species.

In accordance with a preferred manner of the interconnection pattern forming method according to the present invention, an oxide film or carbide is formed on a surface of the interconnection pattern after the irradiation of ultraviolet rays.

In an interconnection pattern forming method according to a second aspect of the present invention, an interconnection layer is first formed on a substrate. The interconnection layer is selectively etched by employing a halogen-type gas, so as to form an interconnection pattern. The interconnection pattern is then irradiated with ultraviolet rays in a gas containing fluorine.

An interconnection pattern forming apparatus according to a third aspect of the present invention includes an etching chamber for selectively etching an interconnection layer formed on a semiconductor substrate by reactive ion etching employing a resist, so as to form an interconnection pattern, an ashing chamber for removing the resist by ashing, and a photoreaction chamber for carrying out a surface treatment of the interconnection pattern with light. The apparatus further includes first transporting means for transporting the semiconductor substrate airtightly from the etching chamber to the ashing chamber, and second transporting means for transporting airtightly the semiconductor substrate from the ashing chamber to the photoreaction chamber.

A semiconductor device according to a fourth aspect of the present invention includes a semiconductor substrate, and an interconnection pattern formed on the semiconductor substrate. A carbide layer is formed to cover the surface of the interconnection pattern.

In the interconnection pattern forming method according to the first aspect of the present invention, the interconnection pattern is irradiated with ultraviolet rays in the atmosphere including reducing species. By this ultraviolet-ray irradiation step, even if a protection film containing halogen is formed on the sidewall of the interconnection pattern upon reactive ion etching, the halogen is removed by, e.g., the following reduction reaction.

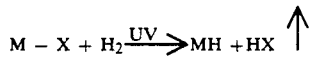

$$M-X + H_2 \xrightarrow{UV} MH + HX \uparrow$$

In the above formula, M denotes a component of the protection film (the details of this component is not clear), and X denotes halogen.

Thus, the halogen is removed from the protection film. As a result, no hydrogen halogenide which causes corrosion of metal interconnections is generated even if the protection film makes contact with water in the atmosphere.

In the interconnection pattern forming method according to the second aspect of the present invention, the interconnection pattern is irradiated with ultraviolet rays in a gas including fluorine. By this ultraviolet irradiation, even if a protection film containing halogen is formed on the sidewall of the interconnection pattern upon reactive ion etching, the halogen is removed by, e.g., a fluorine substitution reaction shown in the formula below.

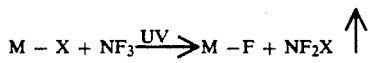

$$M-X + NF_3 \xrightarrow{UV} M-F + NF_2X \uparrow$$

The protection film substituted with a fluorine atom does not generate hydrogen halogenide by hydrolysis even when making contact with water in the atmosphere. Accordingly, no corrosion occurs in the metal interconnections.

In the interconnection pattern forming apparatus according to the third aspect of the present invention, after formation of the interconnection pattern, the semiconductor substrate is transported airtightly into the ashing chamber and further to the photoreaction chamber. Thus, the semiconductor substrate does not make contact with water in the atmosphere during the processing steps.

In the semiconductor device according to the fourth aspect of the present invention, since the carbide layer is formed to cover the surface of the interconnection pattern, this carbide layer prevents the water in the atmosphere from making direct contact with a metal of the interconnection pattern. As a result, corrosion of the interconnection pattern is prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A description will now be given of one embodiment of the present invention with reference to the drawings.

Figure 1A:
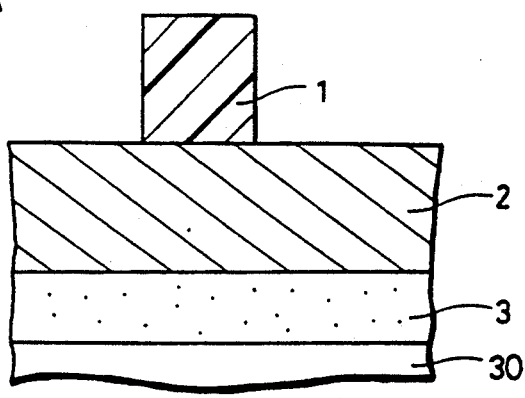
FIGS. 1A-1E are cross-sectional views showing the steps of forming interconnection patterns according to one embodiment of the present invention.
Figure 1B:
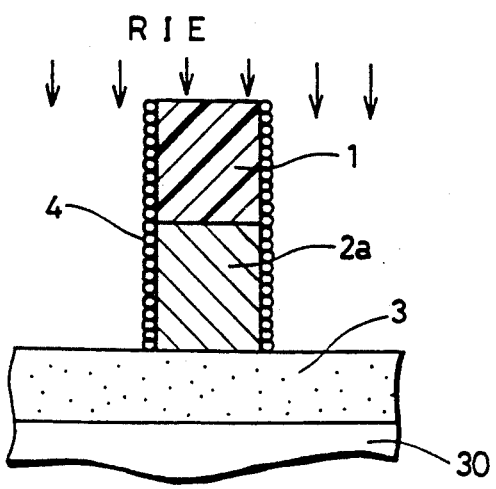
Figure 1C:
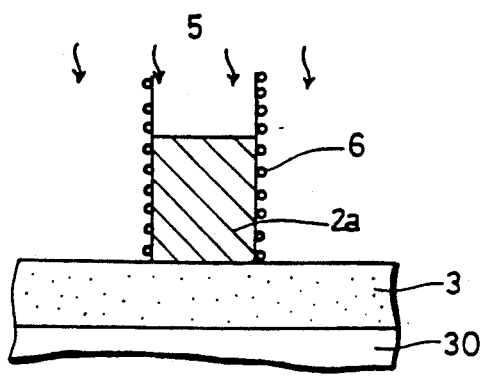
Figure 1D:
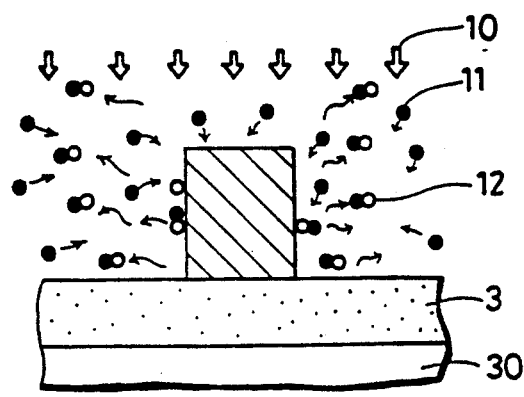
Figure 1E:
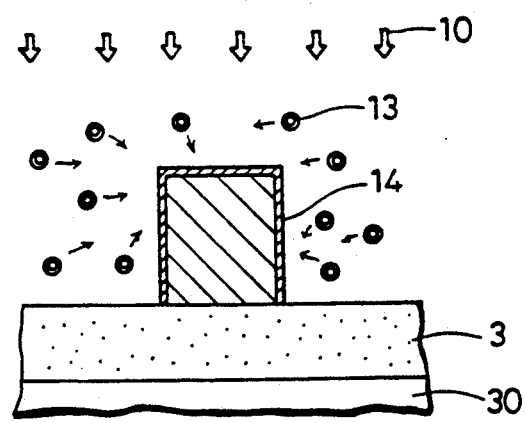
Figure 2:
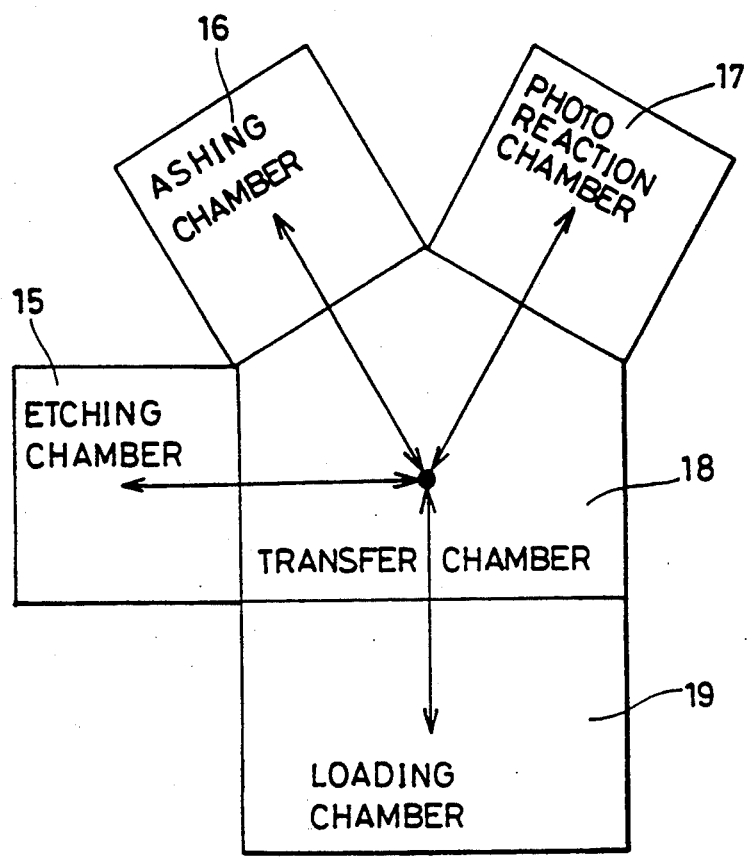
FIG. 2 is a conceptional diagram of an apparatus for forming interconnection patterns according to one embodiment of the present invention.
Figure 3:
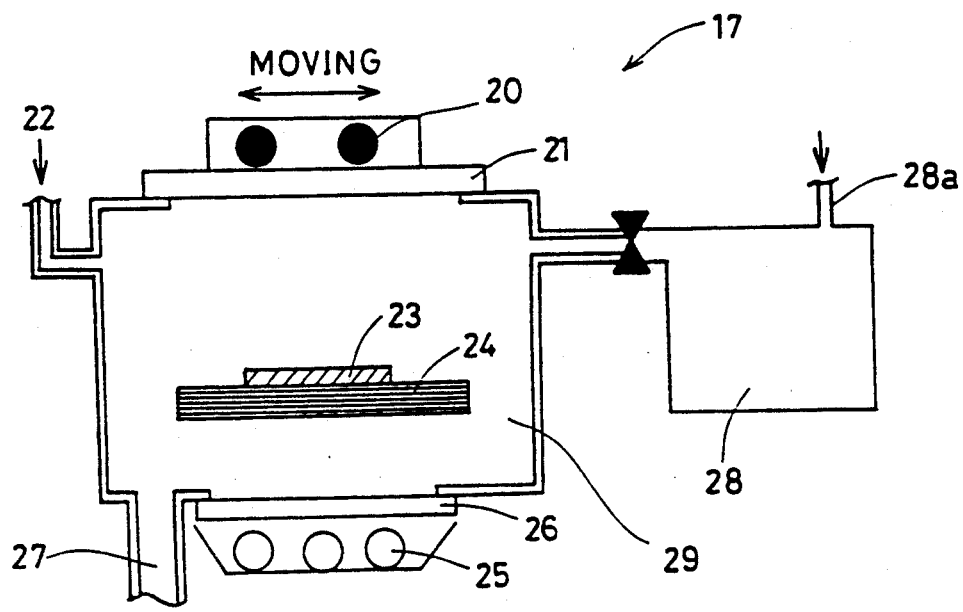
FIG. 3 is a conceptional diagram showing detailed structure of a photoreaction chamber.
Figure 4A:
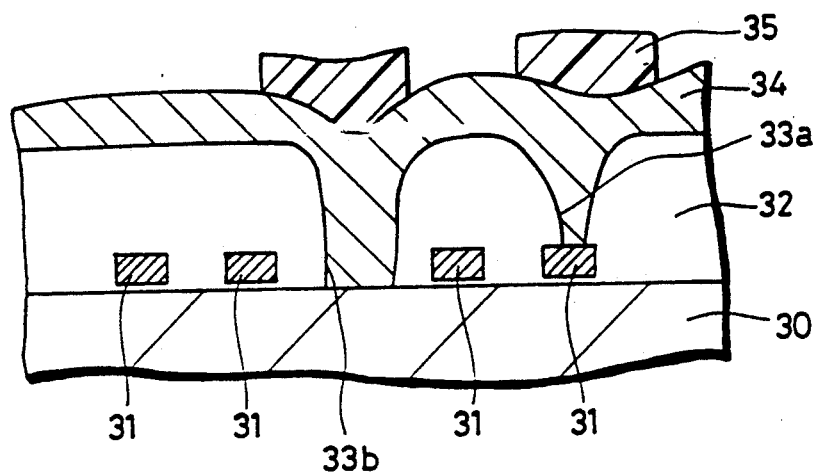
FIGS. 4A and 4B are cross-sectional views showing the step of forming interconnection patterns, which is one step of a manufacture process of a semiconductor device.
Figure 4B:
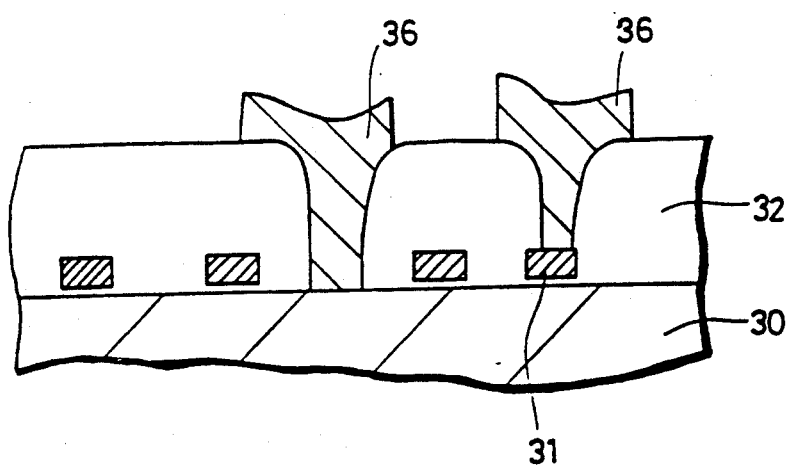
Figure 5A:
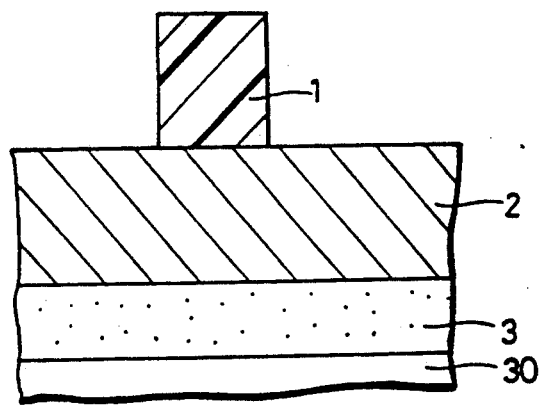
FIGS. 5A-5D are cross-sectional views showing disadvantages of a conventional method of forming interconnection patterns.
Figure 5B:
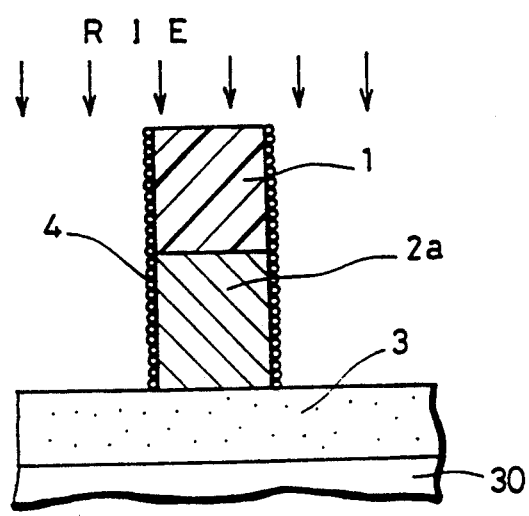
Figure 5C:
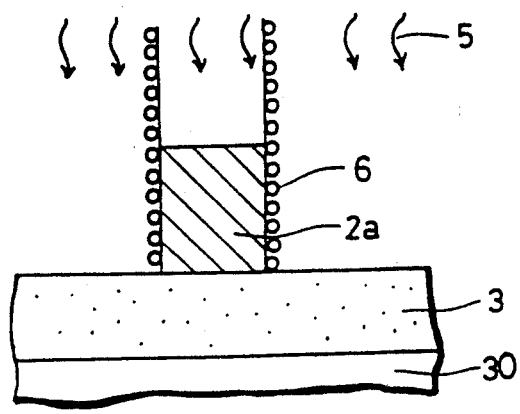
Figure 5D:
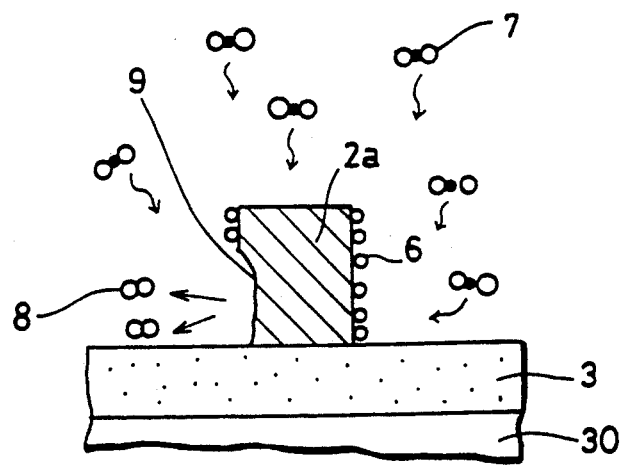

FIG. 2 is a conceptional diagram of an apparatus for realizing the steps shown in FIGS. 1B-1E. The apparatus comprises a loading chamber 19. Loading chamber 19 is connected to a wafer transfer chamber 18. An etching chamber 15 is connected to wafer transfer chamber 18. An ashing chamber 16 is connected to wafer transfer chamber 18. A photoreaction chamber 17 is also connected to wafer transfer chamber 18. The apparatus comprises transporting means for transporting airtightly a semiconductor substrate from loading chamber 19 to etching chamber 15 and transporting means for transporting airtightly the semiconductor substrate from etching chamber 15 to ashing chamber 16. The apparatus further comprises transporting means for transporting airtightly the semiconductor substrate from ashing chamber 16 to photoreaction chamber 17. FIG. 3 is a conceptional diagram showing detailed structure of photoreaction chamber 17.

A description will now be given of a method of forming an interconnection pattern on the semiconductor substrate with reference to the figures.

A lower insulator film 3 is formed on a semiconductor substrate 30, with reference to FIG. 1A. A metal interconnection layer 2 is then formed on lower insulator film 3. Metal interconnection layer 2 is formed of a metal such as Al, AlSi, AlSiCu, Cu, Mg, Al-Cu and so on. A resist pattern 1 is formed on metal interconnection layer 2.

Referring to FIGS. 1A and 2, the semiconductor substrate having resist pattern 1 formed thereon is inserted in loading chamber 19. The semiconductor substrate is transported from loading chamber 19 via wafer transfer chamber 18 to etching chamber 15. A processing shown in FIG. 1B is carried out in etching chamber 15.

That is, referring to FIG. 1B, a reactive ion etching is carried out by a halogen-type gas, for example, a plasma of a mixed gas of $SiCl_4/Cl_2/BCl_3$, with resist pattern 1 used as mask. This enables selective etching of metal interconnection layer 2 and then formation of an interconnection pattern 2a. During this reactive ion etching, a protection film 4 including halogen (Cl) is formed on a sidewall of resist pattern 1 and that of interconnection pattern 2a.

After formation of the interconnection pattern by reactive ion etching, the semiconductor substrate is transported airtightly from etching chamber 15 to ashing chamber 16, with reference to FIG. 2. A processing shown in FIG. 1C is carried out in this ashing chamber.

That is, referring to FIG. 1C, resist pattern 1 is removed by ashing with a $O_2$ gas. At this time, a protection film 6 including the residual halogen (Cl) is left on the sidewall of interconnection pattern 2a.

Next, with reference to FIG. 2, the semiconductor substrate is transported airtightly from ashing chamber 16 to photoreaction chamber 17. A processing shown in FIG. 1D is carried out in the photoreaction chamber.

A description on the detailed structure of photoreaction chamber 17 is made with reference to FIG. 3 prior to a description on the processing step of FIG. 1D. Photoreaction chamber 17 comprises a processing chamber 29 for carrying out a surface treatment of a semiconductor substrate 23 with light in high vacuum. A sample plate 24 for placing semiconductor substrate 23 thereon is provided in processing chamber 29. A gas inlet 22 for introducing a gas for the surface treatment with light is provided in processing chamber 29. A gas outlet 27 for putting processing chamber 29 in a high vacuum state is provided in processing chamber 29. A plasma generation chamber 28 for generating a plasma by microwave discharge or the like is connected to processing chamber 29. A gas inlet 28a for introducing a gas into plasma generation chamber 28 is provided in plasma generation chamber 28. A low-pressure mercury lamp (ultraviolet light source) 20 is disposed at a position outside processing chamber 29 and opposing to sample plate 24. Low-pressure mercury lamp 20 emits ultraviolet rays of 184.9 nm and 253.7 nm. Processing chamber 29 has a window 21 so that light emitted from low-pressure mercury lamp 20 may enter processing chamber 29. An infrared lamp 25 serving as a light source for heating a sample is provided under processing chamber 29. Processing chamber 29 has a window 26 for introducing infrared rays emitted from infrared lamp 25 into processing chamber 29.

Now, semiconductor substrate 23 subjected to ashing processing is placed on sample plate 24, with reference to FIG. 3. A reducing gas such as of $H_2$, $NH_3$, $Si_2H_2$ and so on is then introduced into processing chamber 29 through gas inlet 22. In this case, an active reducing radical (H·) may be formed in plasma generation chamber 28 to be introduced into processing chamber 29 in place of the reducing gas introduced through gas inlet 22. Low-pressure mercury lamp 20 is turned on to introduce ultraviolet rays of 184.9 nm and 253.71 nm into processing chamber 29. An enhancement in irradiance distribution is achieved by moving low-pressure mercury lamp 25 horizontally. Sample plate 24 is raised in temperature by employing infrared lamp 25. The gas is exhausted through gas outlet 27, to maintain a predetermined pressure in processing chamber 29. By the foregoing processing steps, referring to FIG. 1D, the halogen (Cl) contained in protection film 6, adhering to the sidewall of interconnection pattern 2a becomes a hydrogen halogenide gas (HCl) 12 by the subsequent reduction and is then removed.

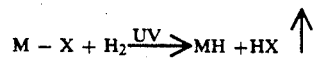

After the surface treatment with light shown in FIG. 1D, the atmosphere in processing chamber 29 is substituted by the atmosphere of an oxidizing gas such as of $O_2$, $O_3$ and so on. That is, a halogen-type gas is exhausted through gas inlet 27, and the oxidizing gas such as of $O_2$, $O_3$ and the like is introduced into processing chamber 29 through gas inlet 22. In this case, an active oxidizing radical (O·) may be formed in plasma generation chamber 28 to be introduced in processing chamber 29 in place of the introduction of the oxidizing gas through gas inlet 22. With processing chamber 29 standing in this atmosphere, low-pressure mercury lamp 20 is turned on, to introduce ultraviolet rays into processing chamber 29. This processing enables uniform and well-controlled formation of a thin film being oxide on the surface of the interconnection pattern 2a from which halogen is removed by reduction, with reference to FIG. 1E. In FIG. 1E, a reference numeral 10 denotes ultraviolet rays, and 13 denotes 0 atoms or 0 radicals. Preferable conditions of the surface treatment with light are shown in Table 1 below.

TABLE 1

| Gas flow rate | |
|---|---|
| Reducing gas ($H_2$) | 50 ~ 100 sccm |
| Oxidizing gas ($O_3$) | 2300 sccm |
| Gas pressure | |
| Reducing atmosphere | 0.1 ~ 1 Torr |
| Oxidizing atmosphere | 1 ~ 300 Torr |
| Irradiance (of low-pressure mercury lamp | 50 mW/cm² or more |
| Sample temperature | 100° C. |
| Light surface treatment time | |
| Reducing atmosphere | 5 min |
| Oxidizing atmosphere | 5 min |

In the foregoing embodiment, the reducing gas is employed with reference to FIG. 1D; however, the present invention is not limited to this. That is, the reducing gas may be replaced by a fluorine contained gas, e.g., a $NF_3$ gas.

In this case, the halogen (Cl) contained in protection film 6 adhering on the sidewall of interconnection pattern 2a is removed by a fluorine substitution reaction shown in the formula below.

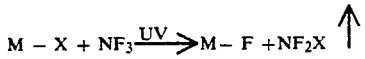

The protection film substituted with a fluorine atom does not generate hydrogen halogenide by hydrolysis even if making contact with water in the atmosphere. Accordingly, no corrosion occurs in the metal interconnections.

In addition, while such a case that a thin film 14 of oxide is formed on the surface of interconnection pattern 2a has been described in the foregoing embodiment, carbide can be formed on the surface of interconnection pattern 2a by introduction of a $CO_2$ or CO gas in place of the oxidizing gas. This carbide or an oxidizing protection film is able to protect metal interconnections against water molecules in the atmosphere, prevent disconnections of the metal interconnections and enhance reliability of the semiconductor device. Since the formation of carbide or oxidizing film is the step to be carried out after formation of interconnection patterns, the carbide or oxidizing film provides an effect of protecting the interconnection patterns against corrosion in wet processing.

Figure 6A:
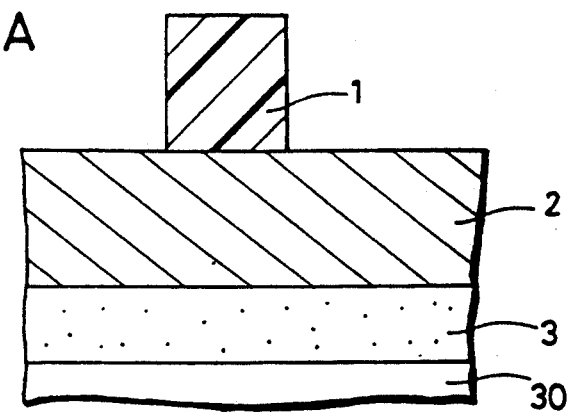
FIGS. 6A-6D are cross-sectional views showing the step of forming a carbide layer on the surface of an interconnection pattern, according to another embodiment.
Figure 6B:
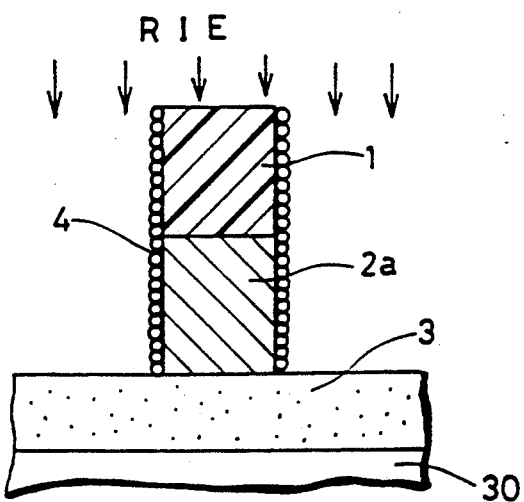
Figure 6C:
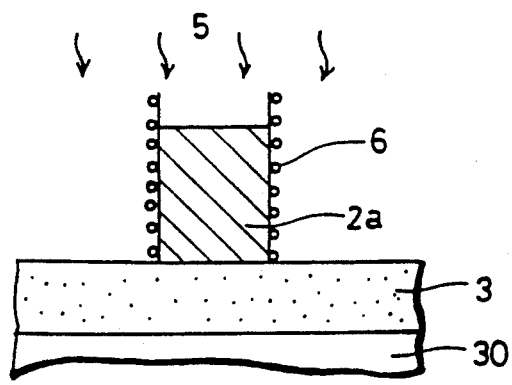

FIGS. 6A–6D are cross-sectional views showing the step of forming a carbide layer on the surface of an interconnection pattern according to another embodiment. Since the steps shown in FIGS. 6A–6C are the same as the steps shown in FIGS. 1A–1C, the same reference characters denote corresponding portions, and a description thereof will not be repeated here.

Figure 6D:
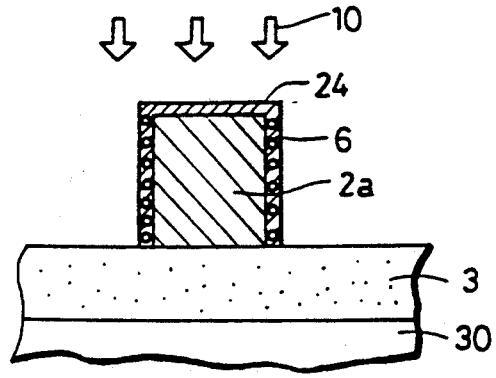

After resist 1 is removed by ashing, with reference to FIG. 6D, interconnection pattern 2a is irradiated with ultraviolet rays 10 while being subjected to a plasma gas of $CO_2$ or CO. Thus, carbide 24 is formed on the surface of interconnection pattern 2a to cover protection film 6. If interconnection pattern 2a is formed of aluminum, carbide 24 has the composition of $Al_xC_y$. In this embodiment, protection film 6 including halogen (Cl) is left on interconnection pattern 2a; however, since carbide 24 exists, protection film 6 does not make direct contact with water in the atmosphere. Consequently, such a problem does not occur that the halogen (Cl) contained in the protection film is subjected to hydrolysis, so as to generate HCl.

As has been described heretofore, in the interconnection pattern forming method according to the first aspect of the present invention, the interconnection pattern is irradiated with ultraviolet rays in the atmosphere including reducing species. Even if the protection film including halogen is formed on the sidewall of the interconnection pattern during reactive ion etching, the halogen is removed by reduction in the ultraviolet-ray irradiation step. Accordingly, even if the protection film makes contact with water in the atmosphere, no hydrogen halogenide causing corrosion of the metal interconnections is produced. This prevents disconnections of the metal interconnections, resulting in the enhancement in reliability of the device.

In the interconnection pattern forming method according to the second aspect of the present invention, the interconnection pattern is irradiated with ultraviolet rays in the gas including fluorine. Accordingly, even if the protection film including halogen is formed on the sidewall of the interconnection pattern during reactive ion etching, the halogen is substituted with fluorine atoms. The fluorine-substituted protection film does not cause generation of hydrogen halogenide by hydrolysis even when making contact with water in the atmosphere. This avoids corrosion and disconnection of the metal interconnections.

The interconnection pattern forming apparatus according to the third aspect of the present invention makes it possible to, after formation of the interconnection pattern, transport the semiconductor substrate airtightly to the ashing chamber and further to the photoreaction chamber. Thus, the semiconductor substrate does not make contact with water in the atmosphere during the processing steps. This results in such an effect that the corrosion of the metal interconnections due to water in the atmosphere can be prevented during the processing steps.

In the semiconductor device according to the fourth aspect of the present invention, since the carbide layer is formed to cover the surface of the interconnection pattern, the carbide layer prevents the water in the atmosphere from making direct contact with the metal of the interconnection pattern. Consequently, the corrosion of the interconnection pattern is prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming an interconnection pattern, comprising the steps of:
    forming an interconnection layer on a substrate;
    selectively etching said interconnection layer by employing a halogen contained gas, so as to form an interconnection pattern; and
    irradiating said interconnection pattern with ultraviolet rays in an atmosphere including reducing species.

2. The method of claim 1, wherein
    said reducing species comprise a gas of $H_2$, $NH_3$ or $Si_2H_2$.

3. The method of claim 1, wherein said reducing species comprise a species from $H_2$, $NH_3$ or $Si_2H_2$ plasma in a radical state.

4. The method of claim 1, wherein
    the pressure of said atmosphere including said reducing species is 0.1–1 Torr.

5. The method of claim 1, wherein
    an irradiation intensity of said ultraviolet rays is more than or equal to 50 mW/cm$^2$.

6. The method of claim 1, further comprising
    step of forming an oxide film around a surface of said interconnection pattern after the irradiation of said ultraviolet rays.

7. The method of claim 6, wherein
    said step of forming said oxide film comprises the step of irradiating said interconnection pattern with ultraviolet rays in an atmosphere including a gas having a high oxidizing property.

8. The method of claim 7, wherein
    the pressure of said atmosphere including said highly oxidizing gas is 1–300 Torr.

9. The method of claim 1, further comprising
    the step of forming carbide around the surface of said interconnection pattern after the irradiation of said ultraviolet rays.

10. The method of claim 9, wherein said step of forming carbide around the surface of said interconnection pattern comprises the step of irradiating said interconnection pattern with ultraviolet rays in an atmosphere of a gas including a carbon atom.

11. The method of claim 10, wherein
said gas including said carbon atom comprises $CO_2$.

12. The method of claim 10, wherein
said gas including said carbon atom comprises CO.

13. The method of claim 9, wherein
said step of forming carbide around the surface of said interconnection pattern comprises the step of irradiating said interconnection pattern with ultraviolet rays in an atmosphere including a carbon radical.

14. The method of claim 1, wherein
said interconnection layer is made of aluminum.

15. A method of forming an interconnection pattern, comprising the steps of:
forming an interconnection layer on a substrate;
selectively etching said interconnection layer by employing a halogen contained gas, so as to form an interconnection pattern;
irradiating said interconnection pattern with ultraviolet rays in a gas including fluorine.

16. The method of claim 14, further comprising
the step of forming an oxide film around a surface of said interconnection pattern after the irradiation of said ultraviolet rays.

17. The method of claim 14, further comprising
the step of forming carbide around the surface of said interconnection pattern after the irradiation of said ultraviolet rays.

18. A method of forming an interconnection pattern, comprising the steps of:
forming an interconnection layer on a substrate;
applying a resist to the surface of said interconnection layer;
using said resist as a mask, selectively etching said interconnection layer by employing a halogen contained gas, so as to form the interconnection pattern;
forming a protective film including halogen on sidewalls of said interconnection layer and of said resist;
ashing said pattern to remove said resist; and
removing the halogen from the sidewalls of said interconnection pattern by irradiating the sidewalls of said interconnection pattern with ultraviolet rays in an atmosphere including a reducing species.

19. A method of forming an interconnection pattern comprising the steps of:
forming an interconnection layer on a substrate;
applying a resist to the surface of said interconnection layer;
using said resist as a mask, selectively etching said interconnection layer by employing a halogen contained gas, so as to form the interconnection process;
forming a protective film including halogen on sidewalls of said interconnection layer and of said resist;
ashing said pattern to remove said resist; and
forming a carbide layer so as to cover the surface of said interconnection pattern.

* * * * *